(12) United States Patent
Roulet

(10) Patent No.: US 6,441,635 B1
(45) Date of Patent: Aug. 27, 2002

(54) METHOD FOR THE STATISTICAL TEST OF INTEGRATED CIRCUITS

(75) Inventor: Fabien Roulet, Aix en Provence (FR)

(73) Assignee: STMicroelectronics, S.A., St. Genis (FR)

( * ) Notice: Subject to any disclaimer, the term of this patent is extended or adjusted under 35 U.S.C. 154(b) by 0 days.

(21) Appl. No.: 09/510,208

(22) Filed: Feb. 22, 2000

(30) Foreign Application Priority Data

Mar. 8, 1999 (FR) .............................................. 99 03119

(51) Int. Cl.$^7$ .............................................. G01R 31/26
(52) U.S. Cl. ..................... 324/765; 324/158.1
(58) Field of Search .............................. 324/158.1, 765, 324/760

(56) References Cited

U.S. PATENT DOCUMENTS 5,235,271 A     8/1993  Kira ........................ 324/158 R
5,635,850 A  *  6/1997  Ogura ........................ 324/760
5,654,632 A  *  8/1997  Ohno ....................... 324/158.1

\* cited by examiner

Primary Examiner—Michael J. Sherry
Assistant Examiner—Paresh Patel

(57) ABSTRACT

In a method for testing integrated circuits present on a silicon wafer, a full sequence for the test of an integrated circuit comprises a plurality of elementary tests. The test method comprises preliminary steps consisting of the classification of the elementary test steps into statistically essential test steps and statistically secondary test steps and in defining a limited test sequence that comprises only statistically essential elementary test steps. The integrated circuits are then tested by means of a test loop comprising a first test step consisting of the application, to K integrated circuits, of a full test sequence and a second test step consisting of the application, to N following integrated circuits, of a reduced test sequence.

20 Claims, 3 Drawing Sheets

METHOD FOR THE STATISTICAL TEST OF INTEGRATED CIRCUITS

BACKGROUND OF THE INVENTION

Since the manufacturing yields for integrated circuits are below 100%, the electrical test of integrated circuits 2 that are still present on a silicon wafer 1 makes it possible to identify and reject integrated circuits that are defective or that lack the expected characteristics, before the wafer is sliced and before the individualized integrated circuits are mounted in a package or on an interconnection medium. Since mounting and assembly costs can represent up to 50% of the cost price of the finished product, this operation is essential for reducing production costs, especially in the context of mass production.

By way of an example, FIG. 1 shows a silicon wafer 1 on which a large number of integrated circuits 2 having the same structure have been made by photolithography. The magnified view of FIG. 2 shows an integrated circuit 2 with an active zone 3 and connection pads 4 electrically connected to the active zone 3. A greater magnification of the active zone 3 would reveal hundreds or even thousands of integrated circuits together constituting various electronic functions that have to be tested.

FIG. 3 gives a very schematic view of a test system comprising a test station 11 connected to a probe 12 by means of a harness of electrical cables 13. The probe 12, shown in detail in FIG. 4, is generally a printed card circuit 14 provided with metal tips 15 coinciding with the connection pads of the integrated circuits 2. The silicon wafer 1 is positioned on a chuck 16 that is mobile in the horizontal plane and the integrated circuits 2 are tested one after the other by shifts and by upward and downward motions of the chuck 16. The entire system is driven by a test program loaded into a memory 17 that controls the shifts of the chuck 16 and determines the electrical characteristics of the test signals to be applied to the integrated circuits.

Despite its advantages, the electrical test of integrated circuits on silicon wafers is a process that proves to be long and costly. A full test sequence for an integrated circuit comprises various test steps that are independent of one another and have to be successively performed so that the integrated circuit may be considered to be "good", namely suitable for commercial distribution. Each test step enables the checking of an electrical or logic characteristic of the integrated circuit and requires from a few milliseconds to some hundreds of milliseconds in order to be performed. In all, a full test sequence may last several seconds. This duration multiplied by the number of integrated circuits to be tested gives a total test time that is not negligible. For example, the test of a wafer of 6,000 integrated circuits, each requiring 5 seconds to be tested, takes more than eight hours if the integrated circuits are tested one after the other.

To overcome this drawback, test probes for the simultaneous test of several integrated circuits have emerged. Thus, there has been a passage from the individual test of integrated circuits to the simultaneous test of 4, then 8 and then 16 integrated circuits. The latest equipment enables the simultaneous test of up to 32 simple integrated circuits such as EEPROM memories. However, the technique of simultaneous test is not the best approach in terms of cost, for the complexity and price of the test equipment increase proportionally with the number of simultaneously tested integrated circuits.

Another method that considerably reduces test time consists in testing only a part of the integrated circuits on a silicon wafer by "skipping over" integrated circuits along the rows of integrated circuits. This method enables the detection of the silicon wafers that are entirely "bad" because of problems occurring during manufacture. However, this method does not enable the efficient detection of the defective integrated circuits distributed randomly on a silicon wafer and thus gives low yields.

Thus, the manufacturers of integrated circuits are divided between the need for fully testing all the integrated circuits to obtain a yield of 100% of "good" integrated circuits at the exit from the production line and the temptation to test only a part of the integrated circuits in order to reduce costs and electrical test time with the risk of marketing defective integrated circuits.

The present invention seeks to overcome this drawback. More particularly, a goal of the present invention is a method that substantially reduces the test time for a set of integrated circuits and, at the same time, gives high yields.

To achieve this goal, the present invention is based on the observation that the various test steps that constitute a full test sequence for an integrated circuit do not provide the same results in statistical terms. In practice, it is constant that certain test steps enable the detection of a high percentage of defective integrated circuits present on a silicon wafer, whereas others detect only a small number of them. Thus, from a statistical viewpoint, there are essential test steps and secondary test steps with respect to the efficiency of the test process.

SUMMARY OF THE INVENTION

On the basis of these observations, the present invention provides for a test method comprising preliminary steps consisting of the classification of the elementary test steps into statistically essential test steps and statistically secondary test steps and defining a limited test sequence that comprises only statistically essential elementary test steps, the method including a test loop comprising: a first test step consisting in testing K integrated circuits by the application, to each integrated circuit, of a full test sequence, and a second test step consisting in testing N following integrated circuits by applying a reduced test sequence to each integrated circuit.

According to one mode of implementation, the method comprises a third test step consisting of the test of M following integrated circuits by the application, to each integrated circuit, of a full test sequence if the number of integrated circuits having failed in at least one statistically secondary test step during the first step is greater than or equal to a predetermined number Q1.

According to one mode of implementation, the second test step is deactivated by the application of a full test sequence to all the integrated circuits remaining on the silicon wafer, when the number of integrated circuits having failed in at least one statistically secondary test step during the third step is greater than or equal to a predetermined number Q2.

According to one mode of implementation, the second test step is deactivated by applying a full test sequence to all the integrated circuits remaining on the silicon wafer when the number of integrated circuits having failed in at least one statistically secondary test step during the first step is greater than or equal to a predetermined number Q3.

When several silicon wafers comprising the same type of integrated circuit are tested one after the other, the second test step may be deactivated for all the integrated circuits of a silicon wafer when the number of previously tested silicon wafers for which a deactivation of the second test step has taken place is greater than a predetermined number.

The present invention also relates to a system for testing integrated circuits comprising a test probe and a test station programmed to carry out the method according to the invention.

BRIEF DESCRIPTION OF THE DRAWINGS

These characteristics as well as others of the present invention shall be explained in greater detail in the following description of the method according to the invention, with reference to the appended figures, of which.

DETAILED DESCRIPTION OF THE PREFERRED EMBODIMENT

Figure 1:
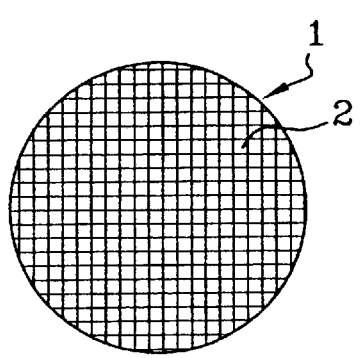
FIGS. 1 and 2 described here above respectively show a wafer of integrated circuits and an integrated circuit, FIGS. 3 and 4 described here above respectively show a system for the electrical test of integrated circuits and a test probe.
Figure 2:
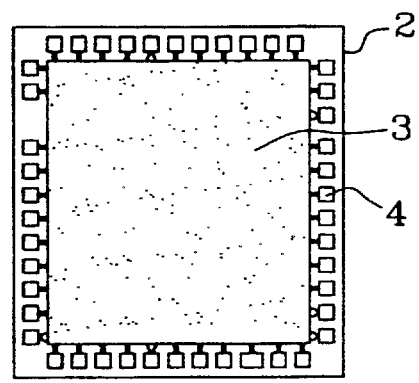

As indicated in the introduction, a full sequence for the test of an integrated circuit is a juxtaposition of a plurality of elementary test steps that are independent of one another, preferably chosen so as not to be correlated, in such a way that a poor result in one test step does not necessarily imply a poor result in another test step. An integrated circuit, in order to be considered as valid, must therefore successfully go through all the elementary test steps, and it is considered to be defective if it fails in at least one of these steps. By way of an example, and solely by way of an example, Table 1 in the second last page of the present description gives a non© exhaustive description of the elementary test steps for an EEPROM (an electrically erasable programmable read© only memory). Thus, for each type of integrated circuit to be tested, those skilled in the art define a certain number of elementary test steps, generally between 20 and 80 test steps, together forming a full test sequence.

The goal of the present invention is to reduce the time needed to test a set of integrated circuits present on a silicon wafer without adversely affecting the efficiency of the test process. More particularly, it is sought to obtain test yields at least equal to 99.8%, namely less than 0.2% of defective integrated circuits in a batch of integrated circuits tested.

To achieve this objective, one idea of the invention is to manage the test of integrated circuits through an alternation of full test sequences and limited test sequences. According to the invention, a full test sequence consists of the juxtaposition of a systematic test sequence S1 and an optional test sequence S2, and a reduced test sequence comprises only the systematic test sequence S1.

Another idea of the invention is to classify the elementary test steps of an integrated circuit in one of the sequences S1 or S2 as a function of their statistical importance with respect to the efficiency of the test process. According to the observations made by the Applicant, it can be seen indeed that the failure rate in the different elementary steps for the test of an integrated circuit is not equiprobable. Certain test steps are successfully undergone by a majority of integrated circuits, and enable the detection of only a small percentage of defective circuits from among all the defective circuits present on a silicon wafer. According to the invention, these steps with low probability of failure are called statistically secondary steps and are classified in the optional test sequence S2. Conversely, other test steps reveal a larger number of defective integrated circuits. These steps with high probability of failure are called statistically essential steps and are classified under the systematic test sequence S1 that is applied to all the integrated circuits.

In practice, the sequence S1 and S2 are defined as a function of the chronology of the product considered, as can be seen in Table 2 on the last page of the present description. Table 2 is a typical example of results obtained with a test sequence comprising 26 elementary test steps BIN1 to BIN26, applied to a wafer with about 6,600 integrated circuits. These results are statistical and are observed in several tens of silicon wafers, for example one or more batches of 25 wafers. For each elementary test step, the column MIN gives the minimum number of defective circuits observed on a wafer, the column MAX gives the maximum number of defective integrated circuits observed on another wafer, and the column STAT gives the mean number (rounded value) of defective integrated circuits per wafer. For certain test steps, the column STAT shows a number of defective circuits equal to zero whereas the value mentioned in the volume MAX is not zero. This means that the case mentioned in the column MAX is exceptional and that the mean value of the defects in the step considered, which is very low, has been rounded out to zero.

According to the invention, the column CLASS determines the category S1 or S2 chosen for each elementary test step as a function of the number of statistical failures indicated in the column STAT. For example, here, the category S2 classifies the steps having a statistical failure rate of less than 8 out of a total of 6600 integrated circuits approximately. To verify the basis of the classification made, it is possible to take the sum of the statistical failures for the test steps classified under S1, in this case 816 failures, and the sum of the statistical failures for the test steps classified under S2, in this case 38 failures. If we assume that these different failures are not correlated, which is generally the case in practice, the result is that the test step classified under S1 statistically enables the detection of 12.36% of defective circuits out of a total of 6600 integrated circuits and the test steps classified under S2 enable the detection of 0.58% of defective circuits. It is thus verified that the test steps classified under S2, namely the secondary statistical steps, detect only a small percentage (4.5%) of the total number of defective integrated circuits.

When this preliminary step to classify the elementary test steps is done, a complete test sequence is available. This complete test sequence is constituted by the juxtaposition of the sequences S1 and S2 and a limited test sequence comprising only the systematic sequence S1.

Figure 3:
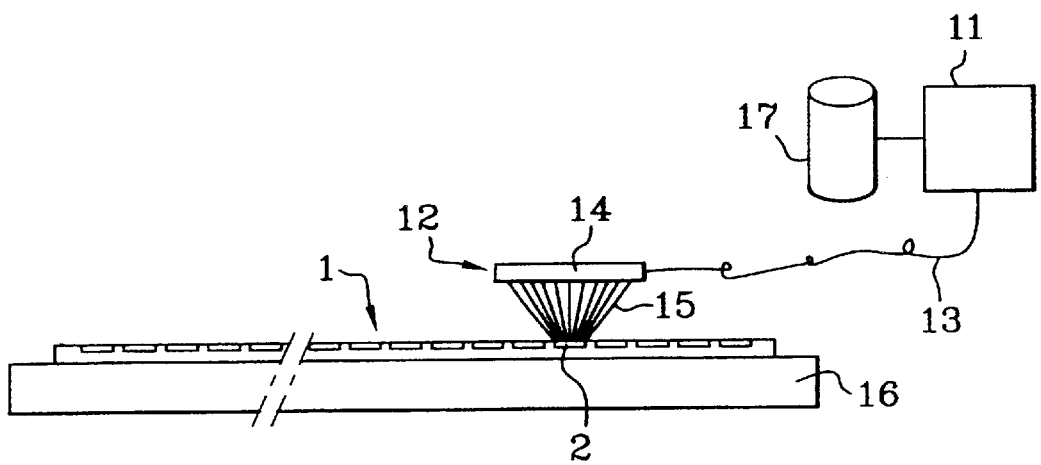
Figure 4:
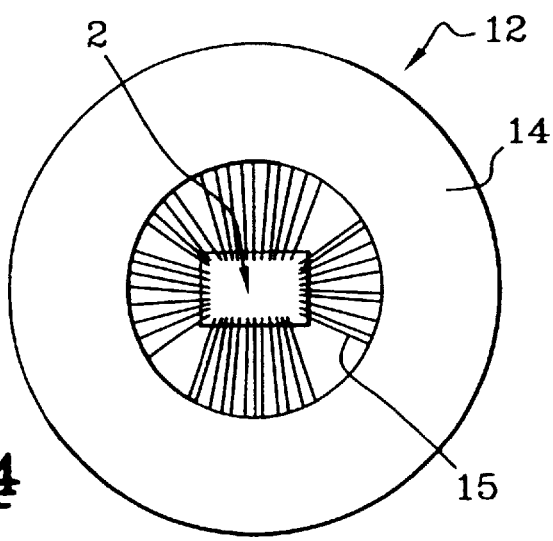
Figure 5:
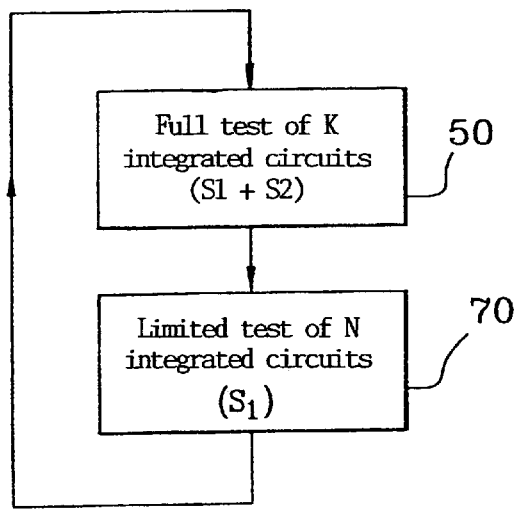
FIG. 5 is a flow chart illustrating a first mode of implementation of the method according to the invention.

FIG. 5 is a flow chart representing a test loop of a program implementing the method according to the invention. This program is loaded into the memory of a test station of the type shown in FIG. 3, already described in the introduction. The test loop according to the invention has a step 50 applied to a number K of integrated circuits and a step 70 applied to a number N of integrated circuits that follow (when the program is started, the K integrated circuits are those that arrive first at the silicon wafer). Step 50 consists of the application to each integrated circuit of a full test sequence comprising the sequences S1 and S2. When the K integrated circuits are tested, the program, during step 70, tests the N following integrated circuits, in applying the reduced sequence S1 to each integrated circuit. When the N circuits are tested, the program returns to step 50 to apply a full test sequence S1+S2 to the following K integrated circuits and so on and so forth.

The test loop 50, 70 is the core of the method according to the invention, and will be amplified by steps described further below enabling the method to be adapted to silicon wafers that do not form part of the statistical profile described in Table 2. It can now be said that the test time Ti for K+N integrated circuits is equal to:

$$Ti=K(TS1+TS2)+N(TS1) \quad (1)$$

TS1 and TS2 respectively designate the total time of the sequence S1 and the total time of the sequence S2, giving the sum of the elementary test steps times that constitute each of the sequences as can be seen at the bottom of Table 2.

By way of comparison, in the prior art, the duration Ta of a full test sequence applied to K+N integrated circuits is equal to:

$$Ta=K+N(TS1+TS2) \quad (2)$$

The method according to the invention thus makes it possible to gain test time equal to:

$$\Delta T=N\ TS2 \quad (3)$$

which may be expressed as a percentage:

$$\Delta T\%=(N/K+N)\ (TS2/(TS1+TS2)) \quad (4)$$

It can be seen that the gain depends on the ratio N/K+N and the ratio of the periods of time between the sequence S1 and the sequence S2. Referring to the example described in Table 2, which gives:

$$TS1=580\ ms\ and\ TS2=1250\ ms \quad (5)$$

and choosing for example:

$$N=10\ K \quad (6)$$

we get a situation where the gain is equal to 62%. This gain in time is very important and enables substantial savings. In general, a gain of 50% makes it possible to halve the investment in test equipment.

What has to be done now is to ascertain that the method according to the invention provides good yield when a silicon wafer does not come under a statistical profile, for various reasons such as problems occurring during manufacture, and therefore has many integrated circuits that fail in the statistically secondary test step. The problem that arises here is that these defective integrated circuits will not be detected during step 70.

Figure 6:
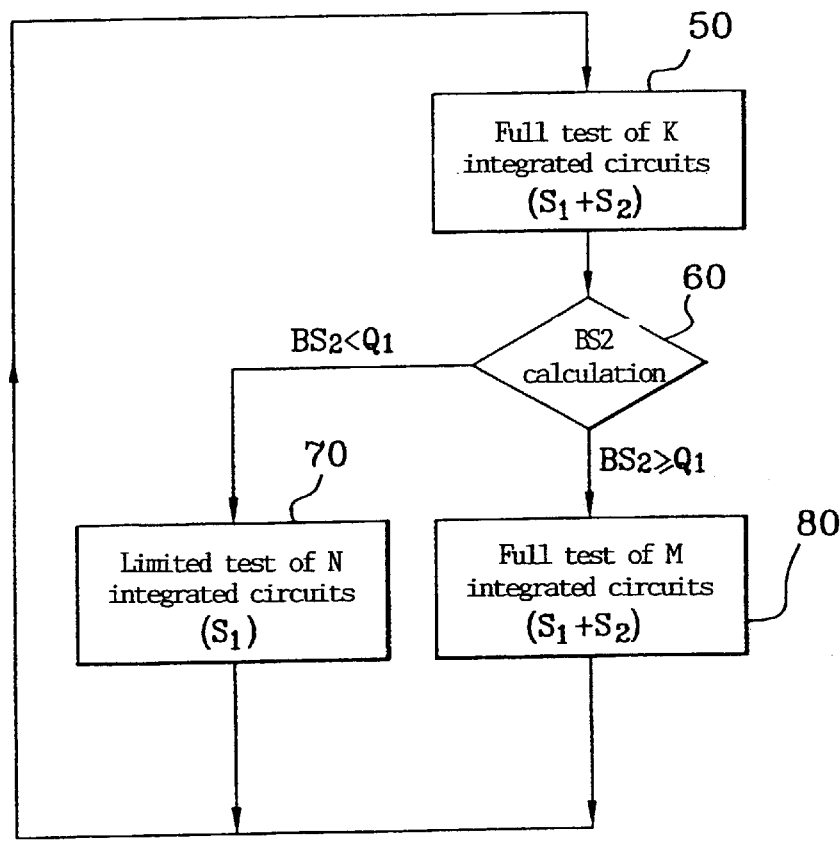
FIG. 6 is a flow chart illustrating a second mode of implementation of the method according to the invention.

Thus, in the flow chart of FIG. 6, between steps 50 and 70, a step 60 is inserted for assessing the result of the test of the K integrated circuits performed during step 50. Step 60 consists in determining the number BS2 of integrated circuits that have failed at the test sequence S2, namely the circuits that have failed in at least one statistically secondary test step. If BS2 is below a number Q1, the result is considered to be part of the statistical profile and the program is sent to step 70, to apply a reduced test to the N integrated circuits that follow. If BS2 is greater than or equal to Q1, the program is sent to a step 80. Step 80 consists of the application to M integrated circuits of a full test sequence S1+S2. When step 80 is over, the program is sent back to step 50 to test K following integrated circuits.

Step 80 is provided on the basis of experimental observations which show that, apart from the random manufacturing defects that form part of the statistical profile, there are repetitive defects affecting integrated circuits that are close to one another on a silicon wafer.

Figure 7:
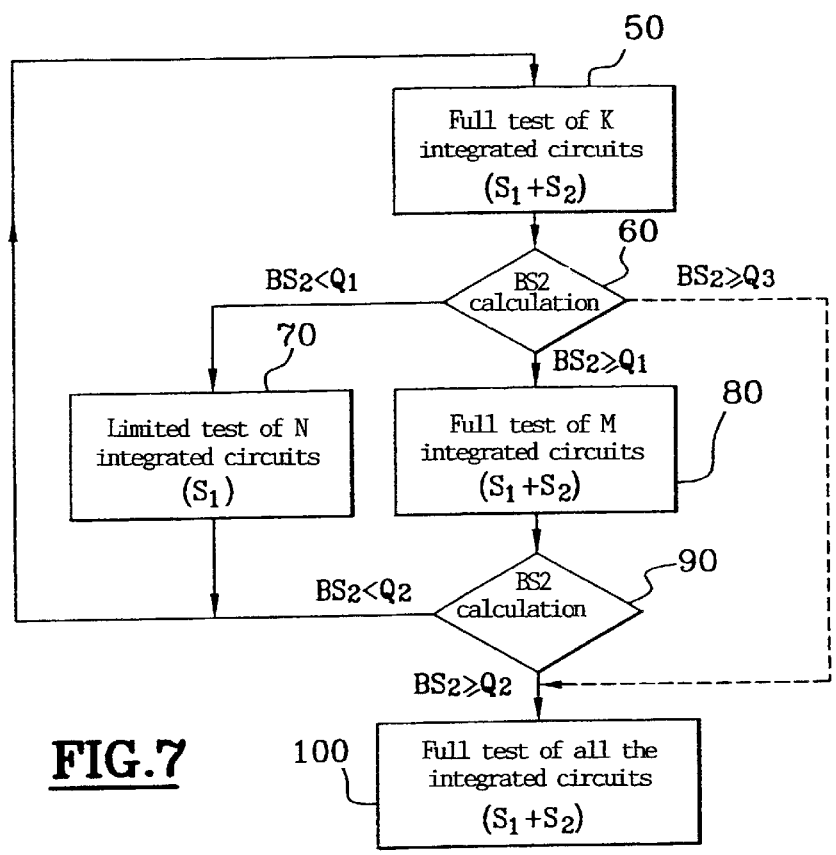
FIG. 7 is a flow chart illustrating a third mode of implementation of the method according to the invention.

In the flow chart of FIG. 7, the method according to the invention is even further secured against such repetitive defects through the insertion, after step 80, of a step 90 to evaluate the result of the test of the M integrated circuits done during step 80. Like step 60, step 90 consists in determining the number BS2 of integrated circuits that have failed in at least one test step of the test sequence S2. If the number BS2 is smaller than a number Q2, it is assumed that the result enters the statistical profile and the program is sent back to step 50. If BS2 is greater than or equal to Q2, the program is sent to a step 100 during which all the integrated circuits remaining on the silicon wafer are integrally tested. The sending of the program to step 100 corresponds to the deactivation of the method according to the invention, the remaining integrated circuits being tested as in the prior art.

Thus, when a silicon wafer does not enter the statistical profile, priority is given to the yield rather than to the speed of the test process. If an entire batch of wafers proves to be "bad", the program will automatically be shunted to step 100. No particular gain in time will be observed but almost all the defective integrated circuits will be detected. However, in the large majority of cases, the program will "turn" in the test loop formed by steps 50 and 70 and the time gain will be substantial. This is why, ultimately, tests for characterizing the method according to the invention, conducted on a large number of wafers, have shown a mean gain of the order of 30% to 50% instead of the theoretical value of 62% calculated further above, with an excellent yield of the order of 91.9%. In other words, this is equivalent to a rate of 0.1% of undetected defective integrated circuits out of a batch of integrated circuits tested.

Again, with a view to improving the efficiency of the method according to the invention, another conditional jump shown in dashes in FIG. 7 may be added during the evaluation step 60. This jump consists in sending the program from step 50 to step 100 if the number BS2 of circuits have failed the test sequences S2 during step 50 is greater than or equal to a number Q3 strictly greater than Q1. In other words, it is considered here, with respect to the statistical results, that it is abnormal for a number Q3 of integrated circuits among the K circuits tested to have failed at a statistically secondary test step.

In practice, a judicious choice of the parameters N/K, M, Q1, Q2 and Q3 enables the best possible compromise to be achieved between the speed of the test process and its efficiency. In the present state of knowledge, the Applicant has not established any theoretical rule with which these parameters can be determined. In the tests made, the parameters Q1 and Q2 have been chosen to be equal to 1 and the parameter Q3 has been chosen to be equal to 2 in order to set up stringent conditions of detection of the integrated circuits that do not come under this statistical profile. Thus, during step 50, if a single integrated circuit proves to be defective with respect to a test step of the sequence S2, the program is sent to step 80. If, during step 80, another integrated circuit proves to be defective with respect to a step of the sequence S2, the statistical test method is deactivated and the program sent to step 100. Optionally, the method according to the invention is also deactivated during step 50 if at least two defective circuits with respect to a step of the sequence S2 are detected.

To define the ratio N/K, the Applicant proposes the following statistical formula:

$$N/K = G/[10\,000(Y(1-Y))] \quad (7)$$

Wherein Y is the manufacturing yield (namely the mean number of defective circuits out of the total number of integrated circuits manufactured) and G is the number of integrated circuits on the silicon wafer. By way of an example, for a wafer of 6600 integrated circuits, N/K is chosen to be equal to 9 when the yield Y is about 0.92 and is chosen to be equal to 14 when the yield Y is about 0.95. In other words, the ratio N/K is increased when the manufacturing yield rises, for the acceleration of the test process.

Finally, the parameter M is preferably below N and is chosen for example to be equal to N/10.

It will clearly be seen by those skilled in the art that the method according to the invention can have various alternative modes of implementation. In general, the method according to the invention is designed to be implemented without distinction in test stations that carry out the individual test of integrated circuits or in stations that carry out the simultaneous test of groups of I integrated circuits, I generally being equal to 4, 8, 16 or 32. In this case, the parameter K may be equal to I or it may be a multiple of I, and the parameters N and M may also be multiples of I. More directly, the parameters K, N and M may be considered to designate groups of I integrated circuits that are tested simultaneously.

Figure 8:
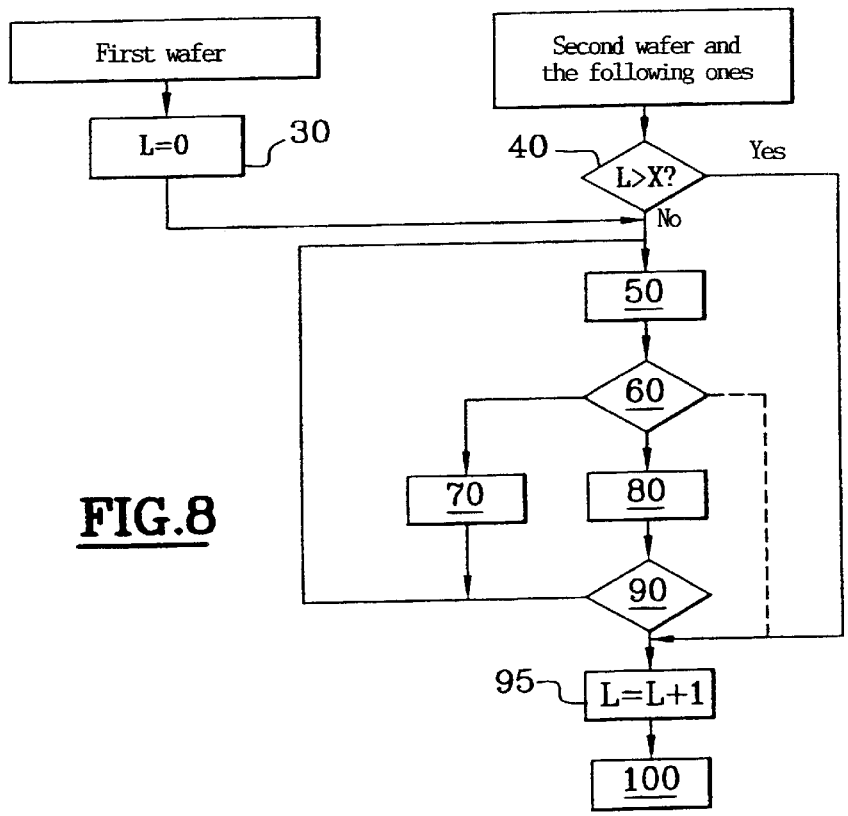
FIG. 8 is a flow chart illustrating a fourth mode of implementation of the method according to the invention.

Yet another variant of the method according to the invention, illustrated by the flow chart of FIG. 8, consists in correlating the results of the tests obtained on several silicon wafers that are obtained from one and the same manufacturing program and are tested one after the other. This aspect of the invention can be applied for example when an uninterrupted test is carried out on a batch of 25 silicon wafers. In a step 30 preceding step 50, a parameter L is set at zero when the first wafer is tested. A step 95 to increment the parameter L by one is inserted before the deactivation step 100. For each following wafer, a step 40 is inserted before step 50 in order to ascertain that the parameter L is not greater than a predetermined value X. If the parameter L is greater than X, the program is made to go directly to step 100 so that all the integrated circuits of the wafer are entirely tested.

Thus, the statistical test method according to the invention is deactivated if the method has already been deactivated X times during the test of the previous wafers. The parameter X may for example be chosen to be equal to 3. This additional precaution is based on experience, which shows that there may be entire batches of silicon wafers giving very poor results.

In practice, other conditions of application of the method according to the invention may be planned. It can be decided for example that the method according to the invention is applicable only to integrated circuits that have not been modified for more than three months, giving a stable statistical profile with a small mean standard deviation and manufacturing yields of over 85%.

TABLE 1

Example of test steps for EEPROM memory

| Step | Title | Description |
|---|---|---|
| 1 | OPEN | Test of contact pads and electrical continuity of the power supply line (output voltage problems) |
| 2 | LEAK HI | Measurement of leakage current in the high state |
| 3 | LEAK LO | Measurement of leakage current in the low state |
| 4 | WR FF 5VO | Write "1s" in the entire memory at 5 V and verify result |
| 5 | WR 00 5VO | Write "0s" in the entire memory at 5 V and verify result |
| 6 | WR FF 2V4 | Write "1s" in the entire memory at 2.4 V and verify result |
| 7 | WR 00 2V4 | Write "0s" in the entire memory at 2.4 V and verify result |
| 8 | WR FF 5V6 | Write "1s" in the entire memory at 5.6 V and verify result |
| 9 | WR 00 5V6 | Write "1s" in the entire memory at 5.6 V and verify result |
| 10 | WR CKB 2V4 | Write a checker-board of "1s" and "0s" at 2,4 V and verify result |
| 11 | WR CKB 5V6 | Write a checker-board of "1s" and "0s" at 5.6 V and verify result |
| 12 | ICC OP 5V6 | Measurement of consumption of current at 5,6 V when chip is in operation |
| 13 | ICC NOP 5V6 | Measurement of consumption of current at 5,6 V when chip is not in operation |
| 14 | WR DIA 5V6 | Writing of "1s" diagonally at 5,6 V and verification |
| 15 | WR DIA 2V4 | Writing of "1s" diagonally at 2,4 V and verification |

TABLE 2

| Test steps | Duration | Defects MIN | Defects MAX | Defects STAT | CLASS |
|---|---|---|---|---|---|
| BIN1 | 60 ms | 101 | 467 | 56 | S1 |
| BIN2 | 60 ms | 0 | 4321 | 281 | S1 |
| BIN3 | 40 ms | 0 | 12 | 2 | S2 |
| BIN4 | 120 ms | 0 | 1027 | 220 | S1 |
| BIN5 | 20 ms | 3 | 414 | 63 | S1 |
| BIN6 | 60 ms | 0 | 87 | 7 | S2 |
| BIN7 | 80 ms | 0 | 9 | 1 | S2 |
| BIN8 | 90 ms | 0 | 8 | 1 | S2 |
| BIN9 | 20 ms | 0 | 11 | 1 | S2 |
| BIN10 | 70 ms | 0 | 14 | 2 | S2 |
| BIN11 | 20 ms | 0 | 38 | 4 | S2 |
| BIN12 | 110 ms | 0 | 1 | 0 | S2 |
| BIN13 | 60 ms | 0 | 0 | 0 | S2 |
| BIN13 | 100 ms | 0 | 1 | 0 | S2 |
| BIN14 | 90 ms | 15 | 1723 | 130 | S1 |
| BIN15 | 60 ms | 0 | 26 | 4 | S2 |
| BIN16 | 80 ms | 0 | 174 | 22 | S1 |
| BIN17 | 200 ms | 0 | 9 | 1 | S2 |
| BIN18 | 50 ms | 0 | 4 | 1 | S2 |
| BIN19 | 60 ms | 0 | 35 | 4 | S2 |
| BIN20 | 90 ms | 0 | 5 | 1 | S2 |
| BIN21 | 20 ms | 0 | 0 | 0 | S2 |
| BIN22 | 30 ms | 0 | 7 | 1 | S2 |
| BIN23 | 30 ms | 0 | 1 | 0 | S2 |
| BIN24 | 70 ms | 72 | 121 | 31 | S1 |
| BIN25 | 60 ms | 1 | 11 | 8 | S2 |
| BIN26 | 80 ms | 32 | 9 | 13 | S1 |
| TS1 | 580 ms | | | | |
| TS2 | 1250 ms | | | | |
| TS1 + TS2 | 1830 ms | | | | |

What is claimed is:

1. A method for testing integrated circuits present on a wafer, in which a plurality of elementary test steps are classified into statistically essential tests and statistically secondary tests and both a full test sequence for an integrated circuit, which includes both the statistically essential elementary tests and the statistically secondary elementary tests, and a limited test sequence for an integrated circuit, which includes only statistically essential elementary test steps, are defined, wherein the method includes a test loop comprising:

testing K integrated circuits on the wafer in a first test step by application of the full test sequence to each integrated circuit;

if a number of integrated circuits failing at least one statistically secondary elementary test during the first test step is smaller than a predetermined number Q1, testing N integrated circuits following the K integrated circuits on the wafer in a next test step by application of the limited test sequence to each integrated circuit; and if the number of integrated circuits failing at least one statistically secondary elementary test during the first test step is greater than or equal to the predetermined number Q1, testing M integrated circuits following the K integrated circuits on the wafer in the next test step by application of the full test sequence to each integrated circuit.

2. A method for testing integrated circuits present on a wafer, in which a plurality of elementary test steps are classified into statistically essential tests and statistically secondary tests and both a full test sequence for an integrated circuit, which includes both the statistically essential elementary tests and the statistically secondary elementary tests, and a limited test sequence for an integrated circuit, which includes only statistically essential elementary test steps, are defined, wherein the method includes a first test loop comprising:

testing K integrated circuits on the wafer in a first test step by application of the full test sequence to each integrated circuit; and if a number of integrated circuits failing at least one statistically secondary elementary test during the first test step is smaller than a predetermined number Q1, testing N integrated circuits following the K integrated circuits on the wafer in a next test step by application of the limited test sequence to each integrated circuit.

3. A method according to claim 2, wherein the method further comprises a second test loop comprising:

testing the K integrated circuits on the wafer in the first test step by application of the full test sequence to each integrated circuit; and if the number of integrated circuits failing at least one statistically secondary elementary test during the first test step is greater than or equal to the predetermined number Q1, testing M integrated circuits following the K integrated circuits on the wafer in a next test step by application of the full test sequence to each integrated circuit.

4. A method according to claim 3, wherein M is smaller than N.

5. A method according to claim 3, wherein the integrated circuits are concurrently tested in groups of I integrated circuits and wherein N, K and M are all equal to I or to an integer multiple of I.

6. A method according to claim 2, wherein the method further comprises a third test loop comprising:

testing the K integrated circuits on the wafer in the first test step by application of the full test sequence to each integrated circuit;

if the number of integrated circuits failing at least one statistically secondary elementary test during the first test step is greater than or equal to the predetermined number Q1, testing M integrated circuits following the K integrated circuits on the wafer in the next test step by application of the full test sequence to each integrated circuit; and if a number of integrated circuits failing at least one statistically secondary elementary test during application of the full test sequence in the next test step is greater than or equal to a predetermined number Q2, applying the full test sequence to all integrated circuits remaining on the wafer.

7. A method according to claim 6, wherein several wafers each containing integrated circuits are consecutively tested, and wherein the full test sequence is employed for all integrated circuits on a wafer after the full test sequence is applied to all remaining integrated circuits on each of a predetermined number of previously tested wafers.

8. A method according to claim 6, wherein the method further comprises a fourth test loop comprising:

testing the K integrated circuits on the wafer in the first test step by application of the full test sequence to each integrated circuit; and if the number of integrated circuits failing at least one statistically secondary elementary test during the first test step is greater than or equal to a predetermined number Q3, applying the full test sequence to all integrated circuits remaining on the wafer.

9. A method according to claim 8, wherein the predetermined numbers Q1 and Q2 are both equal to 1 and the predetermined number Q3 is equal to 2.

10. A method according to claim 8 wherein several wafers each containing integrated circuits are consecutively tested, and wherein the full test sequence is employed for all integrated circuits on a wafer after the full test sequence is applied to all remaining integrated circuits on each of a predetermined number of previously tested wafers.

11. A method according to claim 2, wherein N is greater than K.

12. A system for testing integrated circuits comprising:

a test probe; and a test station, wherein the test station is programmed to carry out a first test loop on a wafer containing a plurality of integrated circuits, the first test loop including:

testing K integrated circuits on the wafer in a first test step using a full test sequence including both statistically essential elementary tests and statistically secondary elementary tests, and if less than a predetermined number Q1 of integrated circuits fail at least one statistically secondary elementary test during the first test step, testing N integrated circuits following the K integrated circuits on the wafer in a next test step using a limited test sequence including only the statistically essential elementary tests.

13. A system according to claim 12, wherein the test station is programmed to carry out a second test loop, the second test loop including:

testing the K integrated circuits on the wafer in the first test step using the full test sequence; and if at least a predetermined number Q1 of integrated circuits fail at least one statistically secondary elementary test during the first test step, testing M integrated circuits following the K integrated circuits on the wafer in the next test step by application of the full test sequence to each integrated circuit.

14. A system according to claim 13, wherein M is smaller than N.

15. A system according to claim 13, wherein the integrated circuits are concurrently tested in groups of I integrated circuits and wherein N, K and M are all equal to I or to an integer multiple of I.

16. A system according to claim 12, wherein the test station is programmed to carry out a third test loop, the third test loop including:

testing the K integrated circuits on the wafer in the first test step using the full test sequence;

if at least a predetermined number Q1 of integrated circuits fail at least one statistically secondary elementary test during the first test step, testing M integrated circuits following the K integrated circuits on the wafer in the next test step by application of the full test sequence to each integrated circuit; and if a number of integrated circuits failing at least one statistically secondary elementary test during application of the full test sequence in the next test step is greater than or equal to a predetermined number Q2, applying the full test sequence to all integrated circuits remaining on the wafer.

17. A system according to claim 16, wherein several wafers each containing integrated circuits are consecutively tested, and wherein the full test sequence is employed for all integrated circuits on a wafer after the full test sequence is applied to all remaining integrated circuits on each of a predetermined number of previously tested wafers.

18. A system according to claim 16, wherein the test station is programmed to carry out a fourth test loop, the fourth test loop including:

testing the K integrated circuits on the wafer in the first test step using the full test sequence; and if the number of integrated circuits failing at least one statistically secondary elementary test during the first test step is greater than or equal to a predetermined number Q3, applying the full test sequence to all integrated circuits remaining on the wafer.

19. A system according to claim 18, wherein the predetermined numbers Q1 and Q2 are both equal to 1 and the predetermined number Q3 is equal to 2.

20. A system according to claim 12, wherein N is greater than K.

* * * * *